United States Patent [19]

Ritchie et al.

[11] Patent Number: 4,633,175

[45] Date of Patent: Dec. 30, 1986

[54] TESTING METHOD AND APPARATUS FOR ELECTRONIC COMPONENTS

[75] Inventors: Kim Ritchie, Myrtle Beach, S.C.; Lonnie Hopkins; John Galvagni, both of Colorado Springs, Colo.

[73] Assignee: AVX Corporation, Great Neck, N.Y.

[21] Appl. No.: 674,519

[22] Filed: Nov. 23, 1984

[51] Int. Cl.$^4$ ............................................ G01R 31/02
[52] U.S. Cl. .............................. 324/158 F; 324/158 R
[58] Field of Search ............ 324/73 PC, 73 R, 158 P, 324/158 F, 158 D, 158 R, 548, 559; 340/635, 638, 639, 650, 651, 653

[56] References Cited

U.S. PATENT DOCUMENTS

| | | | |
|---|---|---|---|
| 3,806,800 | 4/1974 | Bove et al. | 324/158 P |
| 3,949,295 | 4/1976 | Moorshead | 324/158 F |
| 4,463,310 | 7/1984 | Whitley | 324/73 PC |
| 4,571,542 | 2/1986 | Arai | 324/158 F |

FOREIGN PATENT DOCUMENTS 0045373  4/1977  Japan ............................. 324/158 D 0126577 10/1979 Japan ............................ 324/158 R

OTHER PUBLICATIONS

"Elastomeric Conductive Sheet for Microelectronic Connecting, Circuit Board Testing and Mask Plating", Kashiro et al, 10/9/80, 13th Annual Connector Symposium, Philadelphia, Pa., pp. 269-276.
"High-Performance Contactor", Bove, IBM Tech. Dis. Bull., 2/1976, vol. 18, #9, p. 2883.

Primary Examiner—Reinhard J. Eisenzopf
Assistant Examiner—William J. Burns
Attorney, Agent, or Firm—Arthur B. Colvin

[57] ABSTRACT

A method and apparatus for testing and/or burning-in electronic devices such as capacitors is disclosed. The devices are loaded in a matrix having a multiplicity of apertures. A second matrix having complementary apertures is provided, the apertures of the second matrix being filled with fuses. The matrices are pressed together by yieldable electrodes which are connected with a source of current.

9 Claims, 4 Drawing Figures

TESTING METHOD AND APPARATUS FOR ELECTRONIC COMPONENTS

BACKGROUND OF THE INVENTION

1. Field of the Invention

The present invention is directed to a method and apparatus for testing electronic components and particularly ceramic capacitors.

2. The Prior Art

In the manufacture of electronic devices, and particularly ceramic capacitors, a conventional final step in the processing thereof is subjecting the same to test conditions to determine whether or not the individual capacitors conform to prescribed specifications. Certain of the tests may be rapidly conducted, i.e. establishing that the capacitance of a given chip falls within a predetermined range. Tests of the noted sort are typically carried out by advancing the finished capacitors progressively past a testing station at which station the value of the chip may be instantaneously determined.

Where capacitors are to be employed in specialized environments, it may be necessary to subject the same to testing conditions over protracted periods. By way of example, it is frequently necessary to subject capacitors to heating conditions while continuously applying a voltage across the capacitors to determine whether short circuits would develop within the capacitor if used over extended periods in heated environments. Heretofore, such testing methods have necessarily involved complex testing devices. In one testing procedure often referred to as "burn-in" the chips are subjected to temperatures in the order of 100° C. while being simultaneously subjected to a voltage equal to twice the voltage rating of the capacitor.

A method conventionally used for such testing involves mounting a multiplicity of the capacitors to be tested on a board or jig and applying the desired voltage simultaneously across the entire batch of capacitors to be tested or burned-in. Such a circuit has the obvious disadvantage that if a single unit or units evinced a short circuit, the applied voltage would be significantly drawn down, with the result that all of the other parts were improperly burned-in.

In an alternative burning-test method each capacitor is connected to the voltage source via a series connected fuse during the burn-in procedure. Since the fuses cannot withstand the heated environment to which the capacitors must be subjected, a complex multiple gang wiring arrangement is provided whereby the fuses are removed from the oven within which the capacitors are stored during testing and burn-in.

Since it is not uncommon to test several thousand parts simultaneously, the intricacy of the test apparatus will be readily apparent. Additionally, after each testing cycle, a further testing procedure must be effected to determine whether any of the fuses have opened, and to replace the specific fuses which are series connected to capacitors, which short during the burn-in procedure.

Although fuses have heretofore been developed which are susceptible of use in heated environments, no known method or apparatus is adapted to efficiently employ such fuses for a burn-in-testing procedure along the lines noted. Representative examples of fuse devices and/or testing methods of relevance may be found in the following U.S. Pat. Nos. 3,579,061; 3,236,976; 3,579,062; 3,638,083; 3,887,893; 4,107,759; 4,107,762; 4,193,106 and 4,296,398.

SUMMARY OF THE INVENTION

The present invention may be summarized as directed to an improved method and apparatus for the gang burn-in testing of electronic device and particularly capacitors.

In accordance with the invention a multiplicity of capacitors numbering up to in the thousands are mounted in a resilient insulating block or layer. By way of example, the carrier or matrix layer within which the capacitors are supported may comprise an elastomer capable of withstanding the heat of burn-in, the matrix being provided with a multiplicity of throughgoing apertures sized to frictionally receive the capacitors. The method includes providing a second matrix which may be formed of the same elastomeric material, the second matrix being provided with apertures extending through the matrix, the apertures being spaced to register with the apertures of the first mentioned matrix.

The apertures of the second matrix are filled with fuses of a unique type, namely blocks of glass or like insulative material, the surface of which has been coated with aluminum or a like conductive metal capable of withstanding the heat inherent in the burn-in procedure. The distal ends of the fuses are preferably overcoated with a conductive termination metal.

In accordance with the method and apparatus the two matrices, one filled with capacitors to be burned-in and the other filled with fuses are superposed in such manner that a termination of each capacitor is engaged by a termination of each fuse. The thus positioned matrices are sandwiched between a pair of electrodes which are deformable, the electrodes having a surface area which covers the entirety of the surface area of the matrices. Preferably, a pair of backing plates are provided, the backing plates being pressed against the exposed surfaces of the deformable electrodes. The backing plates are pressed toward each other with the result that one deformable electrode is forced into contact with the free ends of the capacitors and the other electrode forced into contact with the free ends of the fuses at the other surface. The noted pressure also functions to assure that each fuse termination is pressed against the corresponding termination of a capacitor. The described sandwich of backing plates, deformable electrodes, and matrices, is disposed within an oven or like treatment apparatus, while simultaneously a voltage is applied across the electrodes. It will thus be apparent that there is defined a multiplicity of parallel circuits each of which circuits includes a capacitor and a fuse.

After a predetermined time in the test-burn-in environment, the package is disassembled. The matrices are separated, following which it is possible to test the fuse carrying matrix to establish which, if any, of the fuses have been opened in the course of the burn-in procedure. Since the capacitors in the corresponding matrix bear a predetermined relationship to the fuses in the alternate matrix, the position of the defective capacitors may be readily established as a function of the position of the blown or opened fuses in the fuse carrying matrix. It is thus a simple task to remove the defective capacitors from the capacitor carrying matrix, the remaining capacitors being thereafter subjected to continuing processing steps or packaged.

It is accordingly an object of the invention to provide a new and improved testing procedure and apparatus for the testing and/or burn-in of electronic components, and particularly ceramic capacitors.

A further object of the invention is the provision of a simple and economical means for burning-in and/or testing capacitors characterized in that the complex circuitry heretofore required and the utilization of expensive fuses is eliminated.

A further object of the invention is the provision of a testing-burn-in apparatus which is coordinated with a manufacturing mode or method used to fabricate capacitors.

A further object of the invention is the provision of a method and apparatus for the burn-in and/or testing of capacitors which enables the facile location of a defective capacitor within the capacitor carrying matrix as a function of the position within the fuse carrying matrix of a blown or open fuse.

In order to attain these objects or such other objects as may appear herein or be hereinafter pointed out reference is made to the accompanying drawings wherein.

Figure 1:
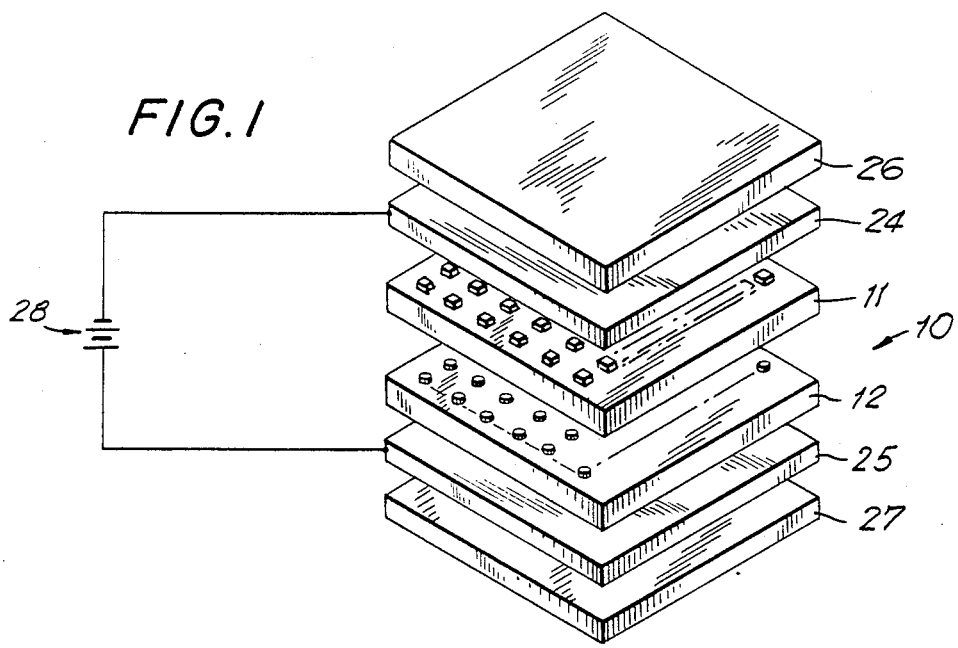
FIG. 1 is a diagrammatic exploded perspective view of a testing-burn-in apparatus of the type described.

In accordance with the invention and referring particularly to FIG. 1 thereof there is disclosed a testing and/or burn-in assembly 10 the components, in said FIG. 1, being separated as would be their condition in a pre-assembled stage of the testing or burn-in operation. The apparatus includes a capacitor holding matrix 11 and a fuse holding matrix 12, each of the said matrices comprising preferably planar blanks of an elastomeric substance having electrical insulating properties, and also being resistant to the procedures which will be employed during the testing or burn-in operation.

By way of example, in a typical burn-in process, ceramic capacitors are subjected to a temperature on the order of 100° C. for a period of one to two hours. Obviously, the elastomer selected should be resistant to degradation when subjected to such conditions.

The capacitor carrying matrix 11 is provided with a multiplicity of throughgoing apertures 13, the apertures being sized to correspond with the dimension of capacitors 14 in such manner that the capacitors are frictionally retained within the apertures 13. Similarly, the thickness of the elastomeric matrix 11 is selected to coordinate with the lengthwise dimension of the capacitors 14 in such manner that the terminations 15,16 of the capacitors project slightly above and below the upper and lower surfaces 17,18 respectively of the matrix 11. In view of the compressability of the matrix, it is satisfactory if the capacitor terminations are flush with or even slightly recessed below the surfaces of the matrix.

While in the illustrated embodiments, a relatively limited number of throughgoing apertures 13 have been illustrated as incorporated in the matrix 11, it is to be understood that the number of such apertures in a single tested batch may be in the thousands.

The matrix 12 is likewise provided with a multiplicity of throughgoing apertures 19 for receiving the fuses 20. It will be understood that the positioning of the apertures 19 of matrix 12 and the apertures 13 of matrix 11 is coordinated with the external dimensions of the respective matrices in such manner that when the borders of the matrices are aligned, the multiplicity of respective apertures 19 and 13 will be likewise aligned.

The fuse 20 preferably used in accordance with the invention may be comprised of a glass block 21 of cylindrical or rectangular section the outside surface of which has been coated with an extremely thin film of a metal which is conductive and resistive to the temperatures to which the capacitors are subjected. Illustratively, the fuse 20 may comprise an aluminum coating of 5000 Å thickness, the distal ends of the fuse being preferably overcoated with thickened metal layers 22, 23.

A coating of the noted thickness will melt open or vaporize when current flow through the coating exceeds a predetermined selected value, it being understood that the current carrying capacity of the fuse is a function of the thickness of the coating.

The testing apparatus includes upper and lower electrode plates 24,25 respectively, the electrodes being formed of a spongy or readily deformable highly conductive material. By way of example, but without limitation, the electrodes 24,25 may be comprised of a metal wool, mesh or screen, or an elastomeric backing member surface coated with such wool, mesh, screen or foil.

The apparatus includes upper and lower backing plates 26,27 respectively which may be formed of conductive or non-conductive materials.

Figure 2:
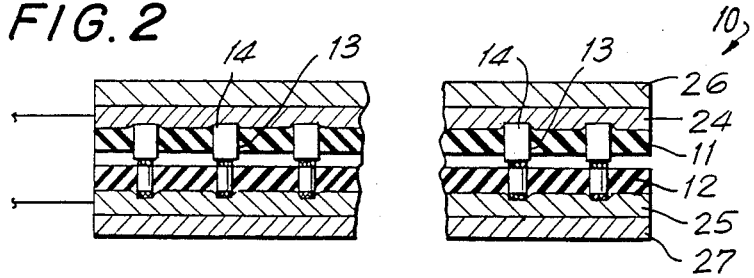
FIG. 2 is a magnified fragmentary section of the apparatus of FIG. 1 in the closed or testing position.
Figure 3:
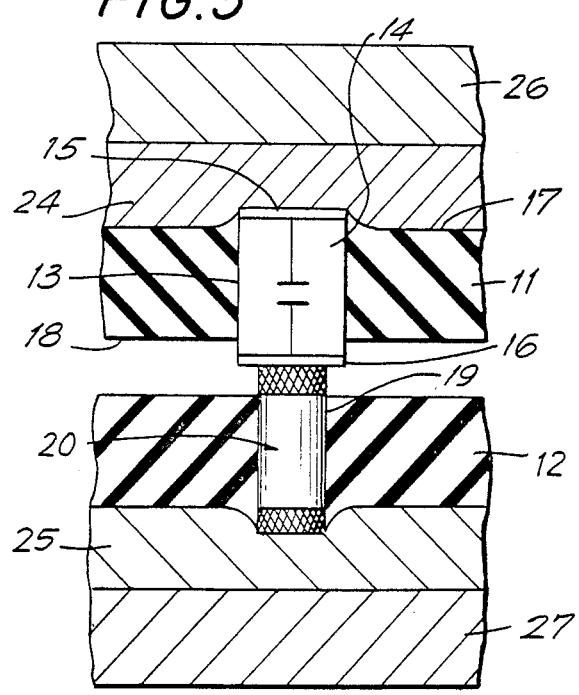
FIG. 3 is a further magnified view of a fragment of the testing apparatus.
Figure 4:
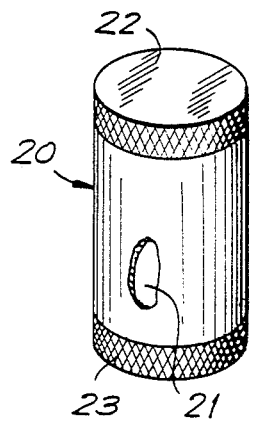
FIG. 4 is a magnified diagrammatic view in perspective of a fuse to be used in conjunction with the method and apparatus of the invention.

The apparatus is employed by first loading a multiplicity of capacitors 14 into the apertures of the matrix 11 and a multiplicity of fuses 20 into the complementally spaced apertures 19 of the fuse holding matrix 12. The filled matrices are superposed and placed between the electrodes 24,25. The thus formed package is placed between backing plates 26,27 which are thereafter moved toward each other until the composite materials are tightly compressed to the backing plates 26,27. As will be apparent from an inspection from FIGS. 2 and 3, the result of the compressive forces exerted by the plates 26,27 is to cause terminations of the capacitors to be tightly pressed against complemental terminations of the fuses, and also to impress the outer distal terminations of the fuses against or into electrode 25 and at the same time impress the exposed terminations 15 of the capacitors 14 against or into the electrode 24.

The thus assembled package is introduced into the desired testing environment while a voltage is simultaneously applied across electrodes 24,25, as by a voltage source 28. As will be evident from the preceeding description, application of the voltage across electrodes 24,25 results in the creation of a multiplicity of parallel circuits each of which circuits comprises a series circuit through a capacitor and a fuse. The applied voltage, which is normally a value two or more times the rated working voltage of the capacitor is maintained during the period of the test. In the event that one or more of the capacitors incorporates or develops a short between adjacent layers of electrode material, the current flow through the series circuit will be sufficient to open the fuse in series with the defective capacitor.

After completion of the test and/or burn-in period the apparatus is opened and the matrices 11,12 are removed. The fuse containing matrix may now be subjected to a further testing procedure to establish which if any of the fuse members have opened during the testing period. The defective fuses may now be removed and replaced. The apparatus employed to test the fuses also provides an indication of which of the capacitors are indicated to be defective. That is to say, in each location in the capacitor carrying matrix 11 complemental to the location of an open fuse in the fuse carrying matrix 12 there may be assumed to be a defective capacitor.

As will be apparent to those skilled in the art, apparatus may be readily devised to automatically disassociate from the matrix 11 those capacitors complementally positioned relative to the fuses which have been opened during the testing and/or burn-in procedure.

After separation of the defective capacitors, the remaining capacitors may be unloaded for further processing and/or packaging and the emptied matrix refilled for the performance of a further manufacturing and testing-burn-in cycle.

Obviously, it is contemplated that the operating sequence above described may be reversed, i.e. the satisfactory capacitors removed from the matrix in advance of removal of the defective capacitors.

As will be apparent to those skilled in the art, numerous variations in sequence and/or details of construction may be made in the light of the instant disclosure without departing from the spirit of the invention. For example, while the apparatus has been described in conjunction with a capacitor testing-burn-in procedure, it is equally suitable for use with other electronic components. Accordingly, the invention should be broadly construed within the scope of the appended claims.

Having thus described the invention and illustrated its use, what is claimed as new and is desired to be secured by Letters Patent in the United States is:

1. The method of simultaneously processing electronic devices such as capacitors which comprises the steps of providing first and second stretchable elastomeric insulating matrices each having a multiplicity of throughgoing apertures formed therein, introducing said electronic devices into said apertures of said first matrix in such manner that said devices are frictionally supported in said apertures and opposed terminals of said devices are exposed at opposite surfaces of said matrix, introducing replaceable fuse members into the apertures of said second matrix in such manner that said fuse members are frictionally supported in said apertures and opposite terminals of said fuse members are exposed at opposite surfaces of said second matrix, superposing said first and second matrices in such manner that each terminal of a fuse in said second matrix engages against a respective terminal of a device in said first matrix, interposing said superposed matrices between first and second yieldable electrodes, one said electrode being in conductive contact with a terminal of each of said devices and the other of said electrode being in conductive contact with a terminal of each of said fuses, and thereafter subjecting said devices to testing conditions while simultaneously causing a voltage to be applied across said electrodes.

2. The method of claim 1 and including the step of sandwiching said electrodes between rigid backing plates.

3. The method in accordance with claim 2 and including the step of heating said devices while said voltage is applied to said electrodes.

4. The method in accordance with claim 1 and including the steps of testing said fuse carrying matrix to establish which of said fuses has been opened in the course of said testing procedure, and segregating the devices in said device carrying matrix which are positioned complementally in said device carrying matrix to the positions of the opened fuses in said fuse carrying matrix.

5. Apparatus for stress testing of capacitors having end terminations comprising first and second generally planar stretchable elastomeric matrices, said matrices each being provided with a multiplicity of throughgoing apertures, the apertures of one said matrix being aligned with the apertures of the other said matrix, the apertures of said first matrix each being sized to accommodate and removeably frictionally retain a capacitor while exposing the said end terminations of said capacitors at opposite sides of said matrix, the apertures of said second matrix being each sized to accommodate and removeably frictionally retain a fuse therein with distal portions of said fuses exposed at opposite sides of said matrix, first and second generally planar electrode means superposed over said first and second matrices respectively in overlying relation of said apertures, electrical current means connected to said electrode means for developing a voltage across said electrode means, and means for urging said electrode means toward each other to thereby press a distal end of the fuses in one said matrix against a termination of the capacitors in the other said matrix and simultaneously press the noninterengaged ends of said fuses and terminations into electrical contact with a respective one of said electrodes.

6. Apparatus in accordance with claim 5 wherein said means for urging said electrode means toward each other comprises a spaced pair of rigid planar compression plate members.

7. Apparatus in accordance with claim 5 and including means for heating said capacitors while yieldable pressure is exerted.

8. Apparatus in accordance with claim 5 in which said first and second generally planar matrices are of elastomeric material, each of the apertures of said first matrix being adapted to retain a capacitor therein by frictional engagement with a central portion thereof, and each of the apertures of said second matrix also being adapted to retain a fuse therein by frictional engagement.

9. Apparatus in accordance with claim 8 in which said first and second generally planar electrode means are resiliently deformable.

* * * * *